(12) United States Patent
Hoogendam et al.

(10) Patent No.: US 7,193,681 B2
(45) Date of Patent: Mar. 20, 2007

(54) LITHOGRAPHIC APPARATUS AND DEVICE MANUFACTURING METHOD

(75) Inventors: Christiaan Alexander Hoogendam, Veldhoven (NL); Erik Theodorus Maria Bijlaart, Rosmalen (NL); Erik Roelof Loopstra, Heeze (NL); Johannes Catharinus Hubertus Mulkens, Waalre (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 120 days.

(21) Appl. No.: 10/946,344

(22) Filed: Sep. 22, 2004

(65) Prior Publication Data

US 2005/0088635 A1   Apr. 28, 2005

(30) Foreign Application Priority Data

Sep. 29, 2003 (EP) .................................. 03256095

(51) Int. Cl.
*G03B 27/52* (2006.01)
*G03B 27/42* (2006.01)
*G03B 27/58* (2006.01)
*G03B 27/32* (2006.01)

(52) U.S. Cl. ..................... 355/30; 355/53; 355/72; 355/77

(58) Field of Classification Search ............... 355/30, 355/53, 72, 77
See application file for complete search history.

(56) References Cited

U.S. PATENT DOCUMENTS

| | | | | |
|---|---|---|---|---|
| 3,573,975 A | 4/1971 | Dhaka et al. | ............... | 117/212 |
| 3,648,587 A | 3/1972 | Stevens | ....................... | 95/44 |
| 4,346,164 A | 8/1982 | Tabarelli et al. | ............ | 430/311 |
| 4,390,273 A | 6/1983 | Loebach et al. | ............ | 355/125 |
| 4,396,705 A | 8/1983 | Akeyama et al. | ........... | 430/326 |
| 4,480,910 A | 11/1984 | Takanashi et al. | ............ | 355/30 |
| 4,509,852 A | 4/1985 | Tabarelli et al. | .............. | 355/30 |
| 5,040,020 A | 8/1991 | Rauschenbach et al. | ...... | 355/53 |
| 5,121,256 A | 6/1992 | Corle et al. | ................. | 359/664 |
| 5,610,683 A | 3/1997 | Takahashi | .................... | 355/53 |
| 5,715,039 A | 2/1998 | Fukuda et al. | ................ | 355/53 |
| 5,825,043 A | 10/1998 | Suwa | ......................... | 250/548 |
| 5,900,354 A | 5/1999 | Batchelder | ................. | 430/395 |
| 6,191,429 B1 | 2/2001 | Suwa | ......................... | 250/548 |
| 6,236,634 B1 | 5/2001 | Lee et al. | ................... | 369/112 |
| 6,560,032 B2 | 5/2003 | Hatano | ....................... | 359/656 |

(Continued)

FOREIGN PATENT DOCUMENTS

DE           206 607           2/1984

(Continued)

OTHER PUBLICATIONS

English translation to the Japanese patent document 63-157419 cited by Applicant.*

(Continued)

*Primary Examiner*—Alan Mathews
(74) *Attorney, Agent, or Firm*—Pillsbury Winthrop Shaw Pittman LLP

(57) ABSTRACT

A lithographic projection apparatus is disclosed in which a liquid confinement system, which at least partly confines liquid to a space between the projection system and the substrate, is restricted in its movement in the direction of the optical axis of the apparatus by a stopper.

26 Claims, 4 Drawing Sheets

U.S. PATENT DOCUMENTS

| | | | |
|---|---|---|---|
| 6,600,547 | B2 | 7/2003 | Watson et al. |
| 6,603,130 | B1 | 8/2003 | Bisschops et al. ........ 250/492.1 |
| 6,633,365 | B2 | 10/2003 | Suenaga ...................... 355/53 |
| 2002/0020821 | A1 | 2/2002 | Van Santen et al. ........ 250/492 |
| 2002/0163629 | A1 | 11/2002 | Switkes et al. ............... 355/53 |
| 2003/0123040 | A1 | 7/2003 | Almogy ........................ 355/69 |
| 2003/0174408 | A1 | 9/2003 | Rostalski et al. ........... 359/642 |
| 2004/0000627 | A1 | 1/2004 | Schuster |
| 2004/0021844 | A1 | 2/2004 | Suenaga |
| 2004/0075895 | A1 | 4/2004 | Lin ............................. 359/380 |
| 2004/0108237 | A1 | 6/2004 | Epple et al. |
| 2004/0119954 | A1 | 6/2004 | Kawashima et al. .......... 355/30 |
| 2004/0125351 | A1 | 7/2004 | Krautschik et al. ........... 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 605 103 A1 | 7/1994 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 A | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

English translation of the German patent DD 221 563 A1 cited by Applicant.*
EP Search Report for Application No. EP 03256095.5, dated May 13, 2004.
U.S. Appl. No. 10/820,227, filed Apr. 8, 2004, De Smit.
U.S. Appl. No. 10/860,662, filed Jun. 4, 2004, De Smit.
U.S. Appl. No. 10/773,461, filed Feb. 9, 2004, Duineveld et al.
U.S. Appl. No. 10/698,012, filed Oct. 31, 2003, Flagello et al.
U.S. Appl. No. 10/705,804, filed Nov. 12, 2003, De Smit et al.
U.S. Appl. No. 10/705,805, filed Nov. 12, 2003, Lof et al.
U.S. Appl. No. 10/705,783, filed Nov. 12, 2003, Lof et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/705,785, filed Nov. 12, 2003, Derksen et al.
U.S. Appl. No. 10/724,402, filed Dec. 1, 2003, Simon et al.
U.S. Appl. No. 10/715,116, filed Nov. 18, 2003, Bleeker.
U.S. Appl. No. 10/719,683, filed Nov. 24, 2003, Streefkerk et al.
U.S. Appl. No. 10/705,816, filed Nov. 12, 2003, Lof et al.
U.S. Appl. No. 10/775,326, filed Feb. 11, 2004, Dierichs.
U.S. Appl. No. 10/857,614, filed Jun. 1, 2004, Lof et al.
U.S. Appl. No. 10/367,910, filed Feb. 19, 2003, Suwa et al.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, August 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial Λ/NA scaling equations for resolution, depth of focus, and immersion lithography, *J. Microlith., Microfab., Microsyst.* 1(1):7-12 (2002).

* cited by examiner

LITHOGRAPHIC APPARATUS AND DEVICE MANUFACTURING METHOD

This application claims priority from European patent application EP 03256095.5, filed Sep. 29, 2003, which is incorporated herein in its entirety.

FIELD OF THE INVENTION

The present invention relates to a lithographic projection apparatus and a device manufacturing method.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuator. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a stepper. In an alternative apparatus—commonly referred to as a step-and-scan apparatus—each target portion is irradiated by progressively scanning the, mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "projection lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse-the substrate in the lithographic projection apparatus in a liquid having a relatively high refractive index, e.g. water, so as to fill a space between the final element of the projection system and the substrate. The point of this is to enable imaging of smaller features because the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

During immersion lithography, the free working distance between the final element of the projection system and the substrate is typically of the order of 2 mm. This can lead to difficulty in removing substrates from under the projection system after exposure and also in the refreshment of the immersion liquid during substrate swap. While all of these considerations should be borne in mind in the design of the liquid confinement system, a significant consideration is the protection of the optical components (e.g., lenses) of the projection system during crash of the apparatus.

SUMMARY

Accordingly, it would be advantageous, for example, to provide a liquid supply system with which a low free working distance can be achieved while the projection system is protected in the event of an apparatus crash.

According to an aspect of the invention, there is provided a lithographic projection apparatus comprising:

an illumination system configured to condition a radiation beam;

a support structure constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, the liquid supply system comprising a movable liquid confinement member configured to at least partly confine the liquid to the space, the liquid confinement member restricted in a range of movement in a direction substantially parallel to an optical axis of the apparatus by a stopper.

In this way, a degree of movement of the liquid confinement member may be possible to accommodate variation in substrate thickness and/or increase the distance from the substrate before swap while the apparatus is protected from damage by the liquid confinement member in the case of a crash. Thus, during a crash, the liquid confinement member is restricted in its movement but during operation has free movement in the Z direction (as well as Rx and Ry) required for good performance. This may be achieved without coupling the liquid confinement member to the projection system which might lead to deleterious vibrations in the projection system.

In an embodiment, a base frame configured to support the substrate table is provided, the stopper is on the base frame or the projection system and the projection system is configured to be mechanically decoupled from the base frame.

In an embodiment, the stopper is configured to prevent the liquid confinement member from moving closer to the projection system than a first distance. This may ensure that in the worst case scenario of a crash, which causes a large force to be applied on the liquid confinement member in a direction towards the projection system, that the projection system is protected from damage by the liquid confinement member.

In an embodiment, the stopper is configured to be biased to a position in which the liquid confinement member is prevented by the stopper from moving closer to the projection system than a second distance, wherein the second distance is greater than the first distance. This may allow the liquid confinement member, during normal operation, to be moved away from the substrate and substrate table without risk of impinging on the projection system. This is useful, for example, during substrate swap on the substrate table. This can be arranged in an advantageous way if the stopper is mounted on or is part of a pivotable member.

In an embodiment, the stopper is configured to prevent the liquid confinement member from moving further away from the projection system than a particular position. Thus, for example, should the substrate table crash downwards for any reason, the liquid confinement member can be prevented from falling away from the projection system. Also this may allow the liquid confinement member to be lowered away from the projection system (while still preventing it from falling away in the event of a crash) so that the size of the reservoir of immersion liquid under the projection system can be increased which may be advantageous for circulation of immersion liquid under the projection system.

If the apparatus further comprises a stopper actuator configured to move the stopper thereby to vary the particular position, that actuator may be used to lift the liquid confinement member towards (or away from) the projection system. This is a convenient and neat solution for actuation of the liquid confinement member in the direction of the optical axis of the apparatus without the need for applying a force to the liquid confinement member through the substrate table.

In an embodiment, the stopper comprises a mechanical interference surface which restrict the range of movement by interacting with a surface on the liquid confinement member. This may be a reliable and simple mechanical way of restricting the range of movement of the liquid confinement member. One arrangement is for stoppers to be positioned at three spaced locations around the periphery of the liquid confinement member.

According to a further aspect of the invention, there is provided a device manufacturing method comprising:

at least partly confining a liquid to a space between a projection system of a lithographic apparatus and a substrate using a liquid confinement member;

allowing the liquid confinement member to move relative to the projection system in a direction substantially parallel to an optical axis of the lithographic apparatus in a range restricted by a stopper; and projecting a patterned beam of radiation through the liquid onto a target portion of the substrate.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which corresponding reference symbols indicate corresponding parts and in which.

DETAILED DESCRIPTION

Figure 1:
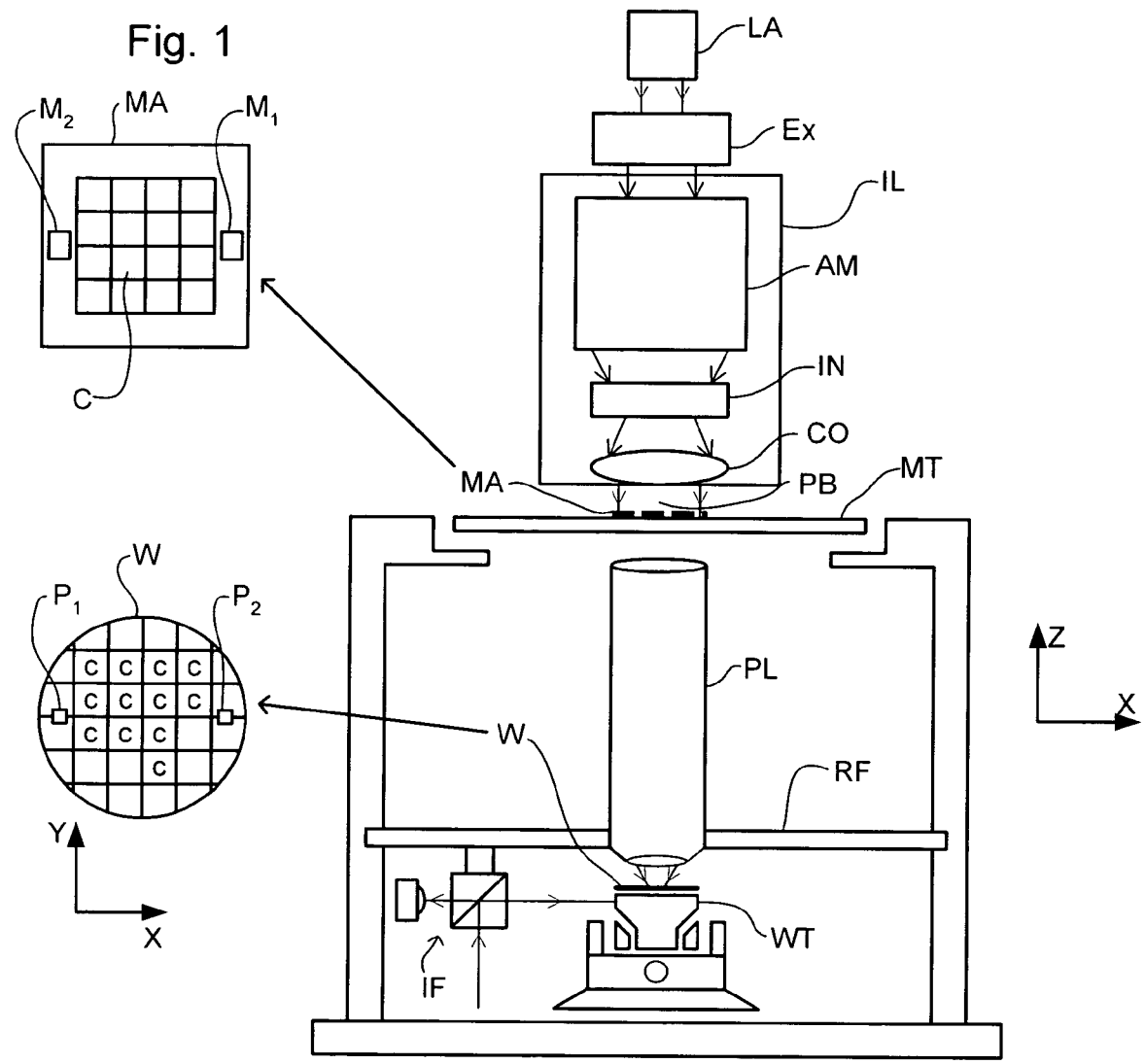
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to a first positioning device for accurately positioning the mask with respect to item PL;

a second object table (substrate table) WT provided with a substrate holder for holding a substrate W (e.g. a resist-coated silicon wafer), and connected to a second positioning device for accurately positioning the substrate with respect to item PL; and a projection system ("projection lens") PL (e.g. a refractive system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioner, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the projection lens PL, which focuses the beam PB onto a target portion C of the substrate W. With the aid of the second positioning device (and interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a stepper (as opposed to a step-and-scan apparatus) the mask table MT may just be connected to a short stroke actuator, or may be fixed.

The depicted apparatus can be used in two different modes:
1. In step mode, the mask table MT is kept essentially stationary, and an entire mask image is projected at one time (i.e. a single "flash") onto a target portion C. The substrate table WT is then shifted in the X and/or Y directions so that a different target portion C can be irradiated by the beam PB;
2. In scan mode,. essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the projection lens PL (typically, M=¼ or ⅕). In this manner, a relatively large target portion C can be exposed, without having to compromise on resolution.

Figure 2:
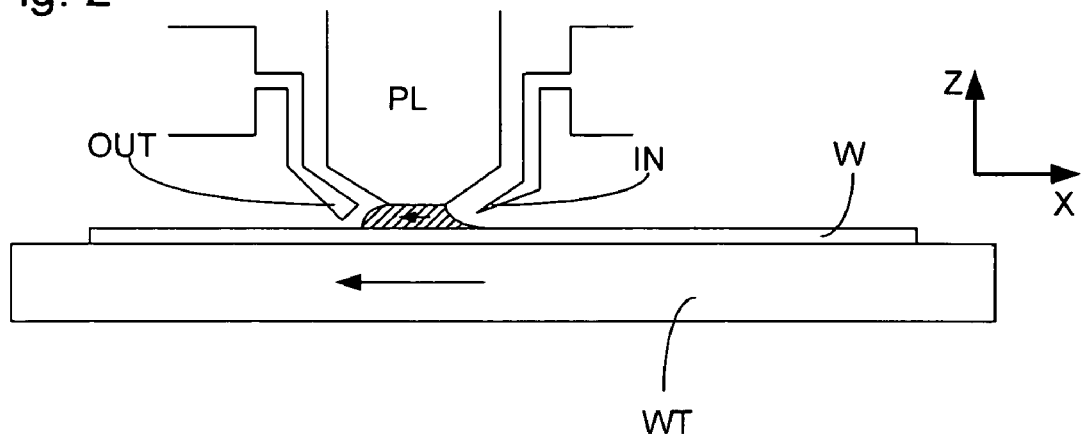
FIGS. 2 and 3 illustrate a liquid supply system with a liquid confinement system to which an embodiment of the present invention may be applied.
Figure 3:
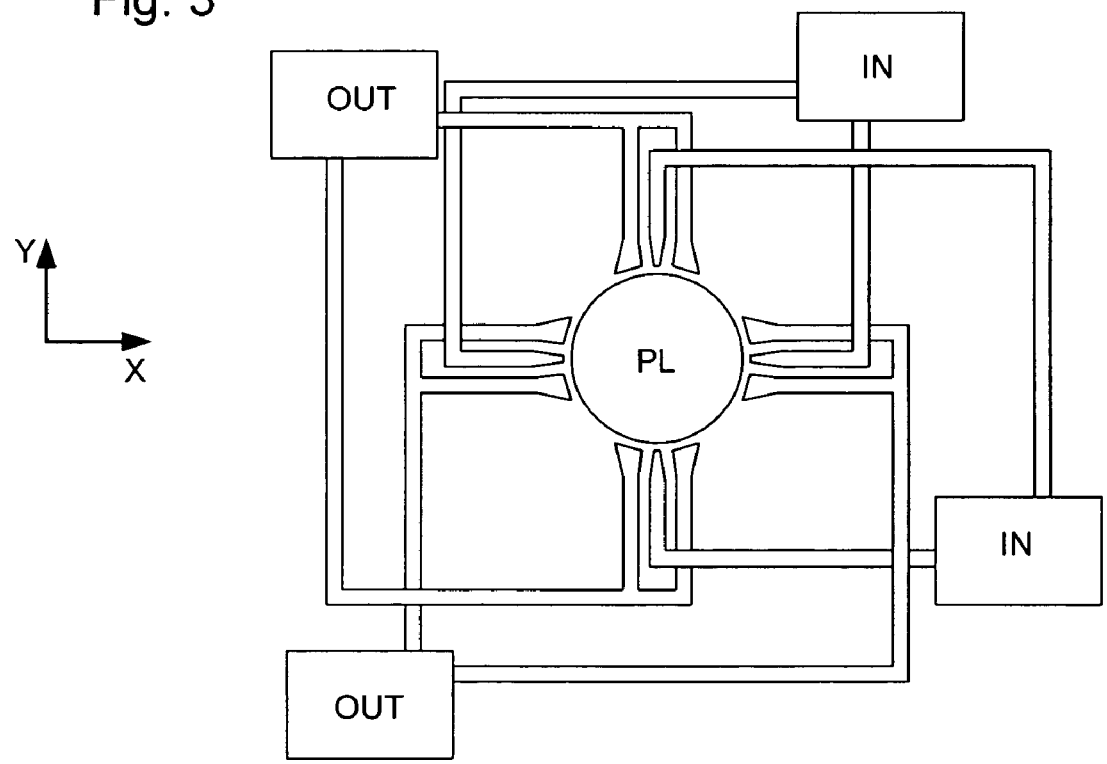

An embodiment of the present invention may be applied to the liquid supply system of FIGS. 2 and 3 or to any other liquid supply system, in particular a localized area liquid confinement system which confines the liquid to a localized area of the substrate. An embodiment of the present invention is suitable for use with a liquid supply system which comprises a seal member 100 which extends around at least a part of a boundary of a space between the final element of the projection system PL and the substrate table WT. A seal is formed between the seal member 100 and the surface of the substrate W. In an embodiment, the seal is a contactless seal such as a gas seal. This type of liquid supply system is described in detail in U.S. patent application Ser. Nos. 10/705,805, 10/705,783, 10/873,647 hereby incorporated in their entirety by reference. It is with reference to this example type of liquid supply system, a localized area liquid confinement system, that one or more embodiments of the present invention is described.

Figure 4:
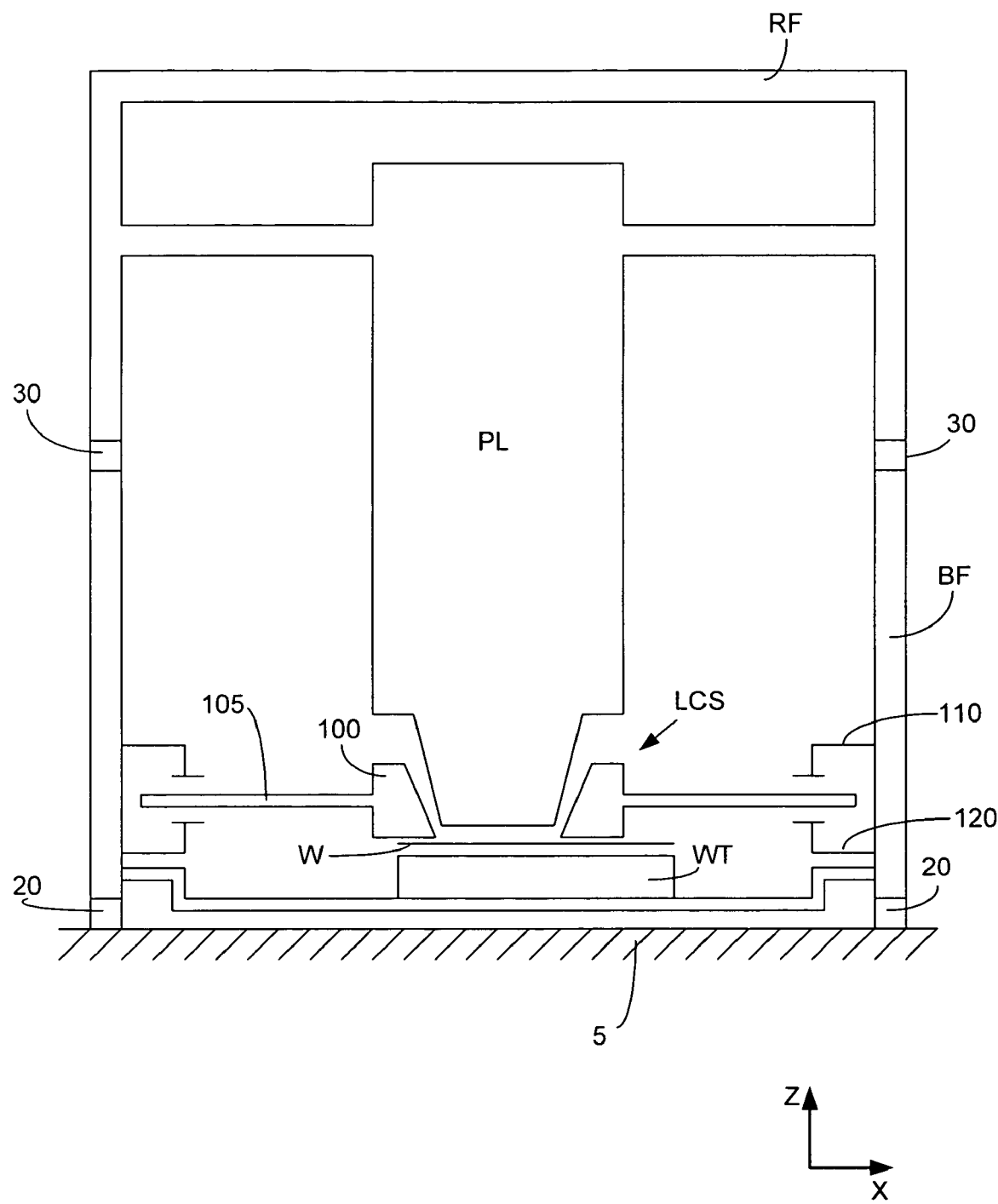
FIG. 4 illustrates the general principles of an embodiment of the present invention in a cross-sectional schematic view through the apparatus.

FIG. 4 illustrates a lithographic projection apparatus in accordance with an embodiment of the present invention in which a base frame BF is isolated from the ground 5 by mechanical isolators 20. The base frame supports the substrate table WT which carries the substrate W. A reference frame RF is supported by but mechanically decoupled from the base frame BF by mechanical isolators 30. The projection system PL is supported by the reference frame. A liquid confinement system LCS comprising a seal member 100 is supported on the substrate table WT through action of a bearing (not illustrated) and may or may not be partially or fully supported directly by the base frame BF. The bearing may be a gas bearing which also acts to seal the immersion liquid in a reservoir between the projection system PL and the substrate W and which helps to prevent damage to the substrate W in the case of a stage crash.

The seal member 100 is moveable in the Z direction (the direction of the optical axis) as well as the $R_x$ and $R_y$ directions. The seal member 100 has flanges 105 which extend towards the base frame BF. Upper and lower stoppers 110, 120 limit the range of movement of the liquid confinement system LCS in a direction parallel to the optical axis of the projection system PL by mechanical interference with surfaces of the flange 105. Movement in the X and Y directions (perpendicular to the optical axis of the projection system) of the liquid confinement system LCS is substantially prevented.

Figure 5:
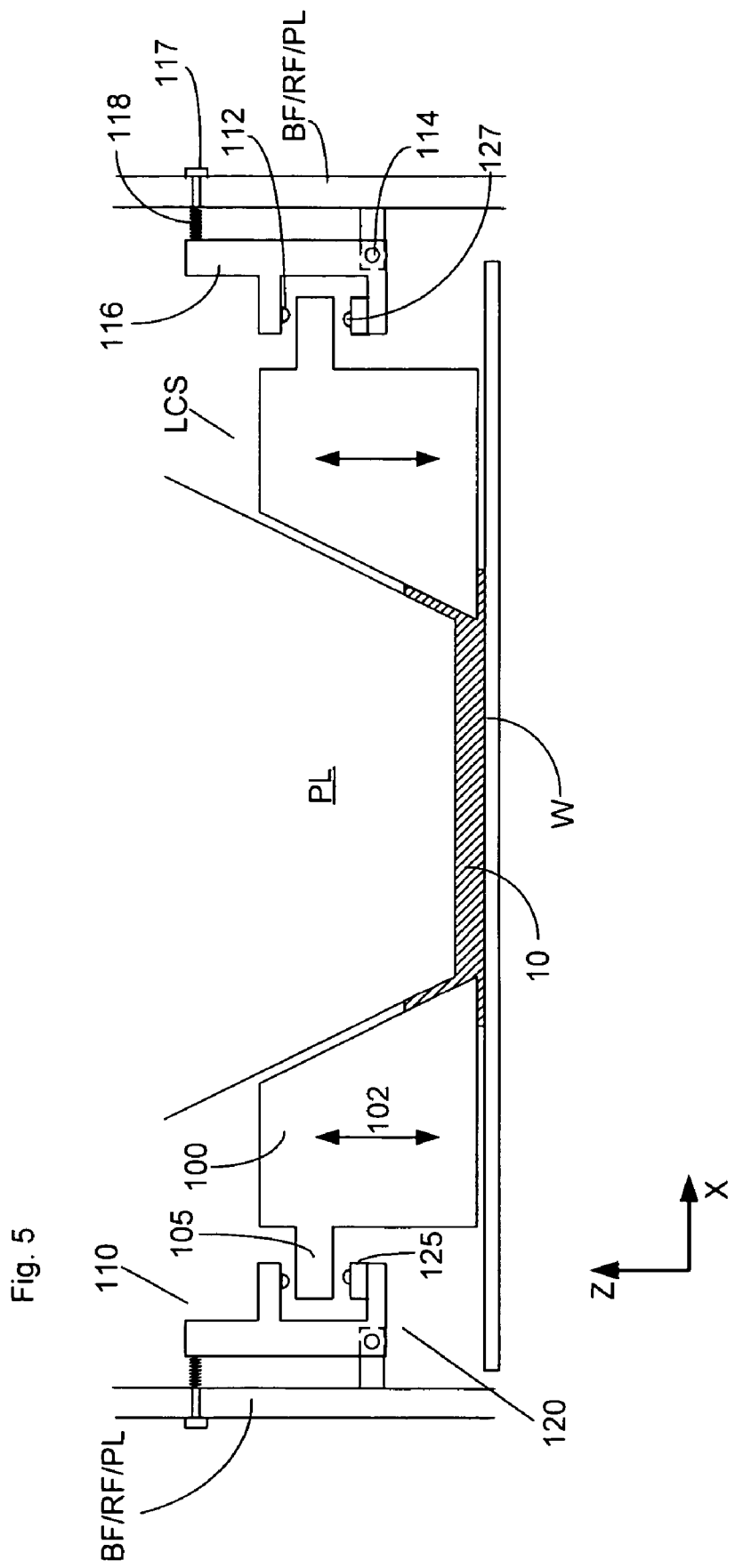
FIG. 5 illustrates schematically an alternative liquid confinement system to which an embodiment of the present invention may be applied.

FIG. 5 illustrates in more detail the interaction between the flange 105 and the stoppers 110, 120.

The stoppers 110 and 120 are positioned at regular intervals around the circumference of the liquid confinement system LCS. In an embodiment, the upper and lower stoppers 110 and 120 are positioned in opposition to one another and there are at least three pairs of upper and lower stoppers around the circumference of the liquid confinement system LCS.

The upper stopper 110 is attached to the base frame BF or to the projection system PL through the reference frame RF or alternatively directly to a strong part of the projection system PL. The upper stopper 110 is attached or part of a pivotable member 116 which pivots around pivot point 114 which is attached to the base frame BF or to the projection system PL through the reference frame RF or directly to a strong part of the projection system. The member 116 has a stopper surface 112 which contacts with an upper surface of the flange 105 of the liquid confinement system LCS to restrict the amount of movement towards the projection system PL the liquid confinement system LCS can make. The pivotable member 116 is biased with a spring 118 so that the surface 112 can move between a first position and a second position on application of an increasing force. The first position is the position-in normal use which prevents the liquid confinement system from contacting the projection system PL and holds it a safe distance (second predetermined distance) away from the projection system PL. When a large force is applied to the liquid confinement system LCS, such as might be experienced during crash of the apparatus, for example by the substrate table WT moving in the Z direction accidentally, the spring 118 will contract and the stopper surface 112 will move to its second position. In this second position the liquid confinement system is still held a first predetermined distance away from the projection system PL so that the projection system PL cannot be damaged by the liquid confinement system LCS coming into contact with it. The exact location of the second position can be varied by a screw member 117. An advantage of having two positions for the upper stopper 110 is that there is some damping in the restriction of movement of the liquid confinement system LCS as it moves towards the projection system PL.

The lower stopper 120 is comprised of a stopper surface 127 which contacts with the lower surface of the flange 105 to prevent further downward movement of the liquid confinement system LCS when the stopper surface 127 interacts and mechanically interferes with the lower surface of the flange 105. The lower stopper 120 is attached to the base frame BF or to the projection system PL through the reference frame RF or directly to the projection system PL. The stopper surface 127 is part of or attached to the pivotable member 116. A stopper actuator 125 can be incorporated into the lower stopper 120 so that the lowest position which the liquid confinement system LCS can achieve can be increased to move the liquid confinement system LCS up towards the projection system PL. Thus, during normal imaging operation of the apparatus the free working distance between the last element of the projection system PL and the substrate W can be low (of the order of 2 mm) while during exchange of the substrate W the liquid confinement system LCS can be moved away from the substrate towards the projection system PL by the actuator 125. The actuator 125 may be a simple bellows type actuator, a piezoelectric actuator, etc. In an embodiment, when not actuated, the actuator 125 is raised so that in the event of power failure the liquid confinement system LCS is moved to the upper stopper 110.

The design of the lower stopper 120 is particularly suited to the use of a shutter member used during substrate swap as disclosed in U.S. patent application Ser. No. 10/705,785, hereby incorporated in its entirety by reference. After exposure, the substrate table WT is moved so that the projection system PL and liquid confinement system LCS is over a shutter member which is a plate of size larger than the aperture of the liquid confinement system LCS. The member is attached to the bottom of the liquid confinement system to block the aperture and is then lifted away from the substrate table WT by actuation of the stopper actuator 125. Once the substrate table WT has been moved away, the liquid confinement system can be lowered to increase the volume of liquid under the projection system which helps with refreshment of the liquid during substrate swap.

As can be seen, an embodiment of the present invention maximizes the movement of the liquid confinement system while allowing the minimization of immersion liquid thickness during exposure. The seal between the seal member 100 and the substrate W are not illustrated in FIG. 5 but the seal can also be used to move the seal member 100 in the Z direction during imaging of the substrate W. Further, one or more actuators may also be present to move the liquid confinement system LCS in the Z direction.

While specific embodiments of the invention have been described above, it will be appreciated that the invention may be practiced otherwise than as described. The description is not intended to limit the invention.

What is claimed:

1. A lithographic projection apparatus comprising:
   an illumination system configured to condition a radiation beam;
   a support structure constructed to hold a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   a liquid supply system configured to at least partly fill a space between a final optical element of the projection system and the substrate with a liquid, the liquid supply system comprising a movable liquid confinement member configured to at least partly confine the liquid to the space and to supply liquid to, remove liquid from, or both, the space, the liquid confinement member being separate from the substrate table; movable during projection of the patterned radiation beam, and restricted in a range of movement in a direction substantially parallel to an optical axis of the apparatus by a stopper.

2. The apparatus according to claim 1, further comprising a base frame configured to support the substrate table, and wherein the stopper is on the base frame or the projection system and the projection system is configured to be mechanically decoupled from the base frame.

3. The apparatus according to claim 1, wherein the stopper is configured to prevent the liquid confinement member from moving closer to the projection system than a first distance.

4. The apparatus according to claim 3, wherein the stopper is configured to be biased to a position in which the liquid confinement member is prevented by the stopper from moving closer to the projection system than a second distance, wherein the second distance is greater than the first distance.

5. The apparatus according to claim 4, wherein the stopper is mounted on or is part of a pivotable member.

6. The apparatus according to claim 1, wherein the stopper is configured to prevent the liquid confinement member from moving further away from the projection system than a particular position.

7. The apparatus according to claim 6, further comprising a stopper actuator configured to move the stopper to vary the particular position.

8. The apparatus according to claim 1, wherein the stopper comprises a mechanical interference surface which restricts range of movement by interacting with a surface on the liquid confinement member.

9. The apparatus according to claim 1, further comprising an actuator configured to move the liquid confinement member in the direction.

10. The apparatus according to claim 1, wherein the stopper is configured to prevent the liquid confinement member from moving closer to the projection system than a particular distance and configured to prevent the liquid confinement member from moving further away from the projection system than a particular position.

11. The apparatus according to claim 1, comprising three stoppers arranged around a periphery of the liquid confinement member.

12. The apparatus according to claim 1, wherein the liquid confinement member is mechanically decoupled from the projection system.

13. A device manufacturing method comprising:
    at least partly confining a liquid to a space between a final optical element of a projection system of a lithographic apparatus and a substrate table using a liquid confinement member separate from the substrate table, the liquid confinement member configured to supply liquid to, remove liquid from, or both, the space;
    allowing the liquid confinement member to move relative to the projection system in a direction substantially parallel to an optical axis of the lithographic apparatus during projection of a patterned radiation beam in a range restricted by a stopper; and
    projecting a patterned beam of radiation through the liquid onto a target portion of a substrate.

14. The method according to claim 13, wherein the substrate is supported on a base frame, the stopper is on the base frame or the projection system, and the projection system is mechanically decoupled from the base frame.

15. The method according to claim 13, wherein allowing the liquid confinement member to move in the range comprises preventing the liquid confinement member, using the stopper, from moving closer to the projection system than a first distance.

16. The method according to claim 15, comprising biasing the stopper to a position in which the liquid confinement member is prevented by the stopper from moving closer to the projection system than a second distance, wherein the second distance is greater than the first distance.

17. The method according to claim 16, wherein the stopper is mounted on or is part of a pivotable member.

18. The method according to claim 13, wherein allowing the liquid confinement member to move in the range comprises preventing the liquid confinement member, using the stopper, from moving further away from the projection system than a particular position.

19. The method according to claim 18, further comprising moving the stopper using an actuator to vary the particular position.

20. The method according to claim 13, wherein the stopper comprises a mechanical interference surface which restricts range of movement by interacting with a surface on the liquid confinement member.

21. The method according to claim 13, further comprising moving the liquid confinement member in the direction using an actuator.

22. The method according to claim 13, wherein allowing the liquid confinement member to move in the range comprises preventing the liquid confinement member, using the stopper, from moving closer to the projection system than a particular distance and preventing the liquid confinement member, using the stopper, from moving further away from the projection system than a particular position.

23. The method according to claim 13, wherein allowing the liquid confinement member to move in the range comprises preventing the liquid confinement member from moving outside the range by using three stoppers arranged around a periphery of the liquid confinement member.

24. A lithographic projection apparatus comprising:
   an illumination system configured to condition a radiation beam;
   a support structure constructed to hold a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   a liquid supply system configured to at least partly fill a space between the projection system and the substrate with a liquid, the liquid supply system comprising a movable liquid confinement member configured to at least partly confine the liquid to the space and mechanically decoupled from the projection system; the liquid confinement member being separate from the substrate table and restricted in a range of movement in a direction substantially parallel to an optical axis of the apparatus by a stopper.

25. The apparatus according to claim 24, further comprising an actuator configured to move the liquid confinement member in the direction.

26. The apparatus according to claim 24, wherein the stopper is configured to prevent the liquid confinement member from moving closer to the projection system than a particular distance and configured to prevent the liquid confinement member from moving further away from the projection system than a particular position.

* * * * *